United States Patent [19]

Nordell et al.

[11] Patent Number: 5,759,263
[45] Date of Patent: Jun. 2, 1998

[54] DEVICE AND A METHOD FOR EPITAXIALLY GROWING OBJECTS BY CVD

[75] Inventors: Nils Nordell; Adolf Schöner, both of Kista, Sweden

[73] Assignee: ABB Research Ltd., Zurich, Switzerland

[21] Appl. No.: 759,417

[22] Filed: Dec. 5, 1996

[51] Int. Cl.⁶ .................................................. C23C 16/00
[52] U.S. Cl. ........................... 117/98; 117/88; 117/103; 117/951; 118/724; 118/725; 118/730
[58] Field of Search .................... 118/724, 725, 118/730; 117/88, 98, 103, 951

[56] References Cited

U.S. PATENT DOCUMENTS 5,108,540  4/1992  Frijlink .................................. 118/724

FOREIGN PATENT DOCUMENTS

| 0 319 122 | of 1987 | European Pat. Off. |
| 0 731 492 | of 1996 | European Pat. Off. |
| 2-96327 | of 1990 | Japan |
| WO 94/23096 | of 1994 | WIPO |
| WO 96/23912 | of 1996 | WIPO |

OTHER PUBLICATIONS

Nordell et al., Design and Performance of a New Reactor Vopor Phase Epitaxy of 3C, 6H and 4H SiC, J. Electrochem. Soc., vol. 143, No. 9, Sept. 1996, pp. 2910–2919.

Chinoy et al., The Effect of Wall HJeating in Horizontal Organometallic Vapor Phase Epitaxal Reactors, J., Electrochem. Soc., vol. 138, No. 5, May 1991, pp. 1452–1455.
Frijlink, A New Versatile., Large Size MOVPE Reactor, Journal of Crystal Growth 93 (1988) pp. 207–215.
Holstein et al., Effect of Buoyancy forces and Reactor Orientation on Fluid Flow and Growth Rate Uniformity in Cold–Wall Channel CVD Reactors, Journal of Crystal Growth 94 (1989) pp. 145–158.
Palmateer et al., New OMVPE Reactor for Large Area Uniform Deposition of InP and Related alloys, Journal of Electronic materials, vol. 18, No. 5, 1989, pp. 645–649.
Nordell et al., Design and Performance of a New Reactor for Vapor Phase Epitaxy of 3C, 6H, and 4H SiC, J. Electrochem. Soc., vol. 143, No. 9, Sep. 1996, pp. 2910–2919.

Primary Examiner—Richard Bueker
Attorney, Agent, or Firm—Pollock, Vande Sande & Priddy

[57] ABSTRACT

A device for epitaxially growing objects by Chemical Vapour Deposition on a substrate (1) comprises a susceptor (4) having a room (6) for receiving the substrate and means (9) for heating the susceptor and thereby the substrate and a gas mixture to be fed to the substrate for said growth. The substrate is arranged close to a first susceptor wall part (7) at least partially delimiting said room. Said heating means is arranged to heat the susceptor to a higher temperature of at least a second wall part (5) delimiting said room thereof and located substantially opposite to said first wall part than the temperature of the first wall part for obtaining a temperature gradient from said second wall part to the substrate and radiative heating thereof by said second wall part. (FIG. 1).

22 Claims, 1 Drawing Sheet

DEVICE AND A METHOD FOR EPITAXIALLY GROWING OBJECTS BY CVD

TECHNICAL FIELD OF THE INVENTION AND PRIOR ART

The present invention relates to a device for epitaxially growing objects of a semiconductor material by Chemical Vapour Deposition on a substrate, comprising a susceptor having a room for receiving the substrate and means for heating the susceptor and thereby the substrate and a gas mixture to be fed to the substrate for said growth, said substrate being arranged close to a first susceptor wall part at least partially delimiting said room, as well as a method according to the preamble of the appended independent method claim.

Accordingly, the invention is applicable to the growth of objects of all types of semiconductor materials, but a common problem when such crystals are to be grown of a high quality will now by way of a non-limitative example be further explained for SiC.

SiC single crystals are in particular grown for being used in different types of semiconductor devices, such as for example different types of diodes, transistors and thyristors, which are intended for applications in which it is possible to benefit from the superior properties of SiC in comparison with especially Si, namely the capability of SiC to function well under extreme conditions. SiC has a high thermal conductivity and is stable at high temperatures, so that devices fabricated from SiC are able to operate at high temperatures, namely up to 1000K. Furthermore, SiC has a more than five times higher breakdown voltage than Si making it well suited for high power applications in which high voltages occur in the reverse blocking state of the semiconductor device.

However, high temperatures are needed for obtaining good ordered growth thereof. The epitaxial growth of silicon carbide by Chemical Vapour Deposition is therefore carried out in a temperature regime in excess of 1400° C. These high temperatures are needed both to obtain decomposition by cracking of the Si- and C-containing precursor gases of said gas mixture and to ensure that the atoms are deposited on the substrate surface in an ordered manner. High temperatures also mean problems with impurities coming out of different types of materials. A common method to heat the substrate is to place it on a heated graphite susceptor, which preferably is covered by a layer of SiC to avoid impurities of the graphite to evaporate and contaminate the growing SiC. However, at the high temperatures needed for said growth there is a considerable mass transport from the susceptor cover to the backside of the slightly colder SiC substrate. This mass transport consumes the susceptor coating under the substrate, which limits the lifetime of the susceptor, since it will not be possible to continue the growth on the substrate once the graphite is exposed and may emit impurities into the SiC layers grown. Furthermore, the backside deposition of the substrate has to be removed by polishing before processing to semiconductor devices can continue. It is emphasized that the susceptor may be of another material than graphite and the coating thereof may also be of another material than SiC, but the problems mentioned above are the same in already known devices of the type defined in the introduction.

SUMMARY OF THE INVENTION

The object of the present invention is to provide a device, which makes it possible to find a remedy to the inconveniences mentioned above of the prior art devices and prolong the lifetime of the susceptor as well as reducing the risk of introducing impurities from said first wall part in the object grown.

This object is in accordance with the invention obtained by arranging said heating means to heat the susceptor so that at least a second wall part of the susceptor delimiting said room thereof and located substantially opposite to said first wall part gets a higher temperature than the temperature of said first wall part for obtaining a temperature gradient from said second wall part to the substrate and radiative heating thereof by said second wall part.

In this way the substrate will take a somewhat higher temperature than said first wall part, so that the mass transport will go from the substrate to said first wall part. This means that any coating of said first susceptor wall part will be protected and even grow by the supply of precursor gases of said gas mixture for said growth. Furthermore, the probability of particles to settle on the substrate during growth is minimized.

According to a preferred embodiment of the invention said heating means is arranged to directly heat said second wall part without directly heating said first wall part. This results in a simple construction of the device, since no heating means is needed on the backside of the substrate for heating said first wall part owing to the fact that the substrate is only heated by radiation from other wall parts of the susceptor. This embodiment is particularly advantageous when it is combined with another preferred embodiment of the invention, in which the device comprises a carrier adapted to have the substrate located thereon and being rotatably arranged about an axis substantially perpendicular to said first wall part, and in which the device also comprises means for rotating said carrier and thereby the substrate about said axis during the growth. Such rotation is usually introduced to average out non-uniformities in the heating field and the gas flow pattern. This combination solves the problem to introduce a simultaneous rotation and heating of the susceptor, since the substrate rotation will in this configuration be separated from the heating, and hence more easily introduced.

According to another preferred embodiment of the invention said heating means is arranged to directly heat said first wall part as well as said second wall part and to heat said second wall part to a higher temperature than the first wall part. Accordingly, a higher temperature of the substrate than of said first wall part therebehind may be obtained by such differentiated heating of said susceptor wall parts, and this may in some applications be desired for obtaining a maximum of adjustability of the parameters for said growth.

According to another preferred embodiment of the invention said heating means is arranged to create a temperature difference between said second wall part and said first wall part exceeding 100° C. It has been found that a temperature difference exceeding 100° C. will mostly be preferred so as to obtain an efficient radiative heating of the substrate by said second wall part resulting in an unambiguously higher temperature of the substrate than of said first wall part.

According to another preferred embodiment of the invention said first wall part forms the ceiling of said susceptor room. This device overcomes the problem of CVD in prior art devices, in which a formation of polycrystalline depositions in the susceptor ceiling of the material grown takes place. From these depositions particles might fall down onto the substrate and result in crystal defects, but this will not longer be possible when the substrate is arranged close to the ceiling formed by said first susceptor wall part.

The object of the invention is also obtained by providing a method according to the appended independent method claim. The advantages of this method are the same as those discussed above for the device of the invention according to the independent device claim.

Further advantages and preferred features of the invention will appear from the following description and the other dependent claims.

BRIEF DESCRIPTION OF THE DRAWING

With reference to the appended drawing, below follows a specific description of preferred embodiments of the invention cited as examples.

In the drawing.

DETAILED DESCRIPTION OF PREFERRED EMBODIMENTS OF THE INVENTION

Figure 1:
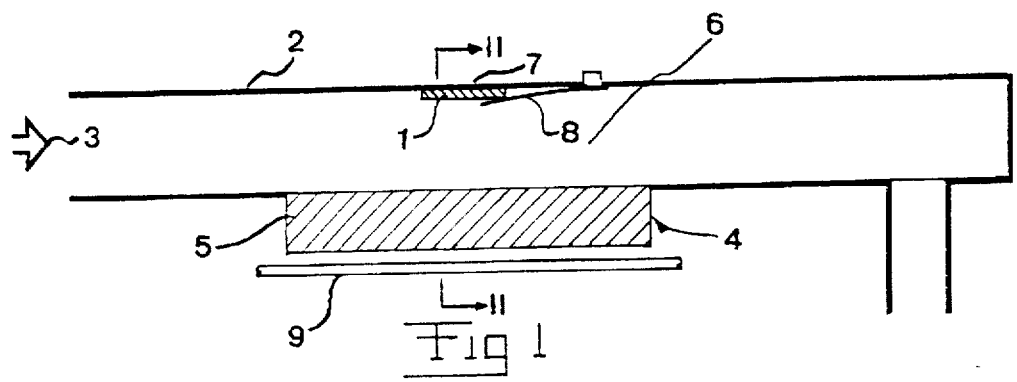
FIG. 1 is a schematic and simplified longitudinal cross-section view of a device according to a first preferred embodiment of the invention.

FIG. 1 shows a device according to a preferred embodiment of the invention for epitaxially growing objects in the form of layers of SiC by Chemical Vapour Deposition on a SiC-substrate 1 in a simplified manner, and it is obvious that the device in question also comprises other means, such as pumps, conduits for supplying gases and so on, but these conventional equipment having nothing to do with the invention has been omitted for the sake of clearness and concentration to the inventional characteristics. The device comprises an outer casing, preferably made of quartz, not shown and an inner casing or inner cell 2, which preferably is made of graphite and is in the form of a tube extending in a longitudinal direction of the outer casing. The inner walls of the inner cell 2 is preferably coated or simply covered by a layer of SiC. A gas mixture of C- and Si-containing gases and a carrier gas, which for example may be $H_2$, Ar or He, will be fed into the inner cell 2 and to the substrate in the direction of the arrow 3. The C- and Si-containing gases are preferably propane and silane, respectively.

The device further comprises a susceptor 4 having a second, comparatively thick wall part 5 made of graphite and also internally coated by a layer of SiC. The susceptor 4 is here defined as including the walls of the casing delimiting the inner room 6 thereof, in which the substrate 1 is received and which extends in the longitudinal direction over the length of said second wall part 5. Thus, the susceptor also includes a first wall part 7, here the ceiling of the susceptor, being arranged close behind the substrate 1, actually having the substrate clamped thereagainst by a clamping means 8 schematically indicated in FIG. 1. Said first susceptor wall part 7 is located substantially opposite to said second susceptor wall part.

The device also comprises a heating means 9 (see also FIG. 2) in the form of a Rf-field radiating coil arranged outside the inner cell 2 and also outside the outer casing not shown in the region of the susceptor and arranged to heat the second susceptor wall part 5 by the Rf-field radiated thereby.

Thus, the heating means 9 will directly or actively substantially only heat said second wall part 5 of the susceptor and in any way not said first wall part 7 behind the substrate 1. This means that the substrate 1 will be heated primarily through radiative heating by said second wall part through the heat radiated therefrom into said room 6 towards the substrate 1. The temperature gradient between said second wall part and said first wall part created this way will preferably exceed 100° C. This way of heating the substrate 1 will mean that the substrate will get a somewhat higher temperature than said first wall part located therebehind, so that the mass transport will go from the substrate to the ceiling and the SiC-coating on the ceiling will not be consumed.

The heating means 9 will also heat said C- and Si-containing precursor gases fed into the inner cell, so that these will be decomposed or cracked and silicon and carbon atoms are deposited on the substrate 1. Another advantage of the higher temperature of the substrate than of said first wall part is that no holes will be created in the SiC cover or coating, which would be the case if the first wall was hotter than the substrate and would mean that impurities would come out of the graphite and settle on the substrate during growth. Furthermore, no particles deposited on the ceiling may fall down onto any front surface of the substrate and result in crystal defects, as in most prior art devices, since here the substrate itself is arranged on the ceiling of the susceptor.

The heating means preferably heats the substrate in this way to a temperature exceeding 1500° C., which would result in a high degree of incorporation of impurities into the epitaxial layers of the substrate should the susceptor not be coated by a layer of SiC. When some other semiconductor material layers are grown by the device the temperature may be lower, but it will always exceed 800° C.

Figure 2:
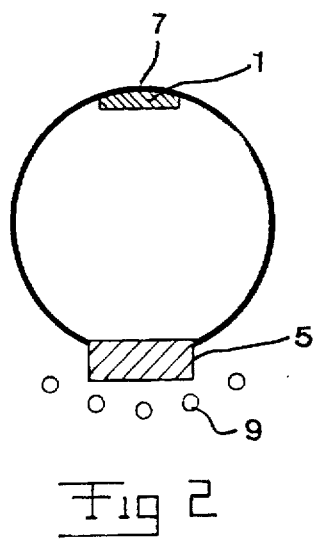
FIG. 2 is a cross-section of the device in FIG. 1 along the line II—II.
Figure 3:
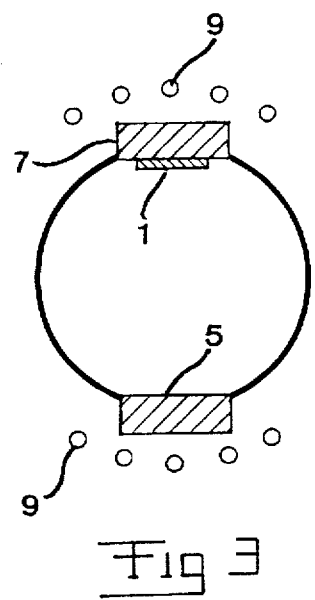
FIG. 3 is a cross-section view corresponding to FIG. 2 of a device according to a second preferred embodiment of the invention.

A device according to another preferred embodiment of the invention is illustrated in FIG. 3, and this differs from that shown in FIGS. 1 and 2 by the fact that the heating means 9 is divided into two parts, so that it will also directly or actively heat said first susceptor wall part 7 located behind the substrate, and said first wall part is therefore also made thick in this case. However, the heating means 9 is controlled to heat said second and first wall parts so that the temperature of the second wall part 5 will exceed that of the first wall part 7 and a temperature gradient from the second wall part to the substrate 1 will be created for radiative heating of the substrate by the second wall part 5. The substrate 1 will also in this case be hotter than said first wall part 7, so that the same advantages as in the first preferred embodiment will be obtained, but the temperature difference between the second and first wall parts may in this embodiment be regulated for obtaining the best possible growth of the SiC single crystal on the substrate 1. It will of course also be possible to provide for switching off only that part of the heating means which directly heats the first wall part 7, which will result in a device behaving in the same way as the device shown in FIGS. 1 and 2.

Figure 4:
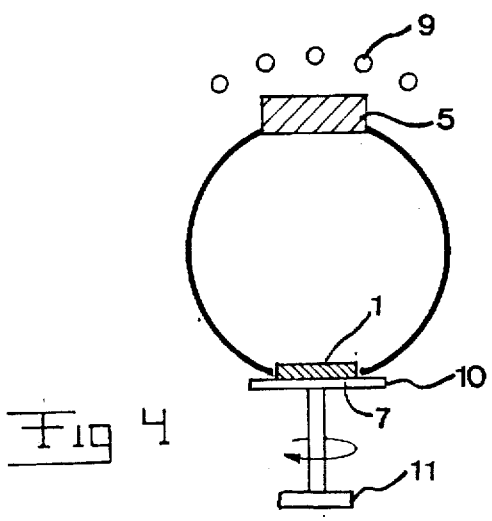
FIG. 4 is a cross-section view corresponding to FIG. 2 of a device according to a third preferred embodiment of the invention.

FIG. 4 illustrates a device according to a third preferred embodiment of the invention, in which the substrate 1 is arranged on a carrier 10, a part of which here forms said first wall part 7. The carrier 10 may be rotated about an axis substantially perpendicular to said first wall part, and the device also comprises means 11 for rotating the carrier 10 and thereby the substrate during the growth for averaging out non-uniformities in the heating field and the flow pattern of the gas mixture fed to the substrate for the growth. The second wall part 5 forms in this case the ceiling of the susceptor, and the heating means 9 is arranged to directly or actively heat the second wall part 5 and indirectly the substrate 1 by radiative heating. Thus, this embodiment corresponds to the one shown in FIG. 2 except for turning the inner cell upside down and the provision of the rotatability of the substrate 1. Accordingly, by using radiative heating for heating the substrate the substrate rotation may in this way be separated from the heating and therefore be more easily introduced. It would of course also be possible to really turn the device shown in FIG. 4 upside down and have the substrate 1 rotating under the ceiling of the susceptor instead. Furthermore, the embodiments according to FIGS. 3 and 4 may also be combined, although the advantage of separating the heating means and the rotating means will then be lost.

High quality films of SiC having a thickness of for instance 0.5–50 μm for the use in primarily high power semiconductor devices may in this way be grown while using the device according to the invention.

The invention is of course not in any way restricted to the preferred embodiments described above, but several possibilities to modifications thereof will be apparent to a man with ordinary skill in the art without departing from the basic idea of the invention as defined in the appended claims. Some of these possibilities to modifications have already been discussed above, and it is repeated that the device according to the invention is not in any way restricted to the growth of objects of SiC, but it will be well suited for the growth of objects of all types of semiconductor materials and especially Group III-nitrides or alloys of such nitrides or one or several such nitrides and SiC, since the same problems will be envisaged for the growth of those materials as for SiC.

It would of course be possible to give the susceptor other cross-section shapes than the substantially circular ones shown in the figures, such as triangulars and rectangulars. Furthermore, the extension of the different wall parts of the susceptor, both in the longitudinal and in the transversal direction may be another than shown in the figures.

The definition "located substantially opposite to said first wall part" in the patent claims is to be interpreted broadly and also comprises the case in which said second wall part is not parallel to said first wall part, and the only condition for being within this definition is that the second wall part is located so that the substrate may be radiatively heated thereby.

The substrate may be of another material than SiC, such as Group III-nitrides or the material grown.

It is emphasized that susceptor is here defined in a somewhat other way than conventionally, where it uses to be only the part directly heated, but here it also includes the other wall parts delimiting the room in which the substrate is received.

We claim:

1. A device for epitaxially growing objects of a semiconductor material by Chemical Vapour Deposition on a substrate (1), comprising a susceptor (4) having a room (6) for receiving the substrate and means (9) for heating the susceptor and thereby the substrate and a gas mixture to be fed to the substrate for said growth, said substrate being arranged close to a first susceptor wall part (7) at least partially delimiting said room, characterized in that said heating means is arranged to heat the susceptor so that at least a second wall part (5) of the susceptor delimiting said room thereof and located substantially opposite to said first wall part (7) gets a higher temperature than the temperature of said first wall part for obtaining a temperature gradient from said second wall part to the substrate (1) and radiative heating thereof by said second wall part.

2. A device according to claim 1, characterized in that said heating means (9) is arranged to directly heat said second wall part (5) without directly heating said first wall part (7).

3. A device according to claim 1, characterized in that said heating means (9) is arranged to directly heat said first wall part (7) as well as said second wall part (5) and to heat said second wall part to a higher temperature than the first wall part.

4. A device according to claim 3, characterized in that said heating means (9) is arranged to carry out the heating of the first and second wall parts independently of each other.

5. A device according to claim 1, characterized in that said heating means (9) is arranged to create a temperature difference between said second wall part (5) and said first wall part (7) exceeding 100° C.

6. A device according to claim 1, characterized in that it comprises a carrier (10) adapted to have the substrate (1) located thereon and being rotatably arranged about an axis substantially perpendicular to said first wall part (7), and that it also comprises means (11) for rotating said carrier and thereby the substrate about said axis during the growth.

7. A device according to claim 1, characterized in that said first wall part (7) forms the ceiling of said susceptor room (6).

8. A device according to claim 1, characterized in that said heating means (9) is arranged to heat the susceptor (4) so as to obtain a temperature of the substrate (1) above 800° C.

9. A device according to claim 8, characterized in that said heating means (9) is arranged to heat the susceptor (4) so as to obtain a temperature of the substrate (1) above 1500° C.

10. A device according to claim 1, characterized in that it is adapted for growing objects of SiC.

11. A device according to claim 1, characterized in that said heating means (9) is a Rf-field radiating means arranged outside the susceptor wall parts to be heated thereby.

12. A device according to claim 1, characterized in that the susceptor wall parts to be heated by the heating means (9) are made of graphite.

13. A device according to claim 12, characterized in that at least said second wall part (5) of the susceptor wall parts is covered by a layer of SiC.

14. A method for epitaxially growing objects of a semiconductor material by Chemical Vapour Deposition on a substrate (1) being arranged close to a first susceptor wall (7) in a room (6) of a susceptor (4) receiving the substrate, said susceptor and thereby the substrate and a gas mixture led to the substrate for the growth being heated, characterized in that the susceptor is heated so that at least a second wall part (5) of the susceptor delimiting said room thereof and located substantially opposite to said first wall part (7) gets a higher temperature than the temperature of said first wall part for obtaining a temperature gradient from said second wall part to the substrate (1) and radiative heating thereof by said second wall part.

15. A method according to claim 14, characterized in that at least said second wall part (5) of the susceptor (4) is directly heated without any direct heating of said first wall part.

16. A method according to claim 14, characterized in that said second wall part (5) as well as said first wall part (7) are directly heated, and that said second wall part is heated to a higher temperature than the first wall part.

17. A method according to claim 14, characterized in that the susceptor (4) is heated so that the second wall part (5)

gets a temperature exceeding the temperature of the first wall part (7) by at least 100° C.

18. A method according to claim 14, characterized in that the substrate (1) is rotated about an axis being substantially perpendicular to said first wall part (7) during the growth.

19. A method according to claim 14, characterized in that the susceptor (4) is heated so that the temperature of the substrate (1) exceeds 800° C. during said growth.

20. A method according to claim 14, characterized in that an object of SiC is grown.

21. A method according to claim 14, characterized in that a Rf-field is radiated towards wall parts of the susceptor to be heated for heating the susceptor (4).

22. A method according to claim 14, characterized in that said growth is carried out in a susceptor (4) having at least said second wall part made of graphite and internally covered by a layer of SiC.

* * * * *